United States Patent [19]

Richard et al.

[11] Patent Number: 4,472,764

[45] Date of Patent: Sep. 18, 1984

[54] TERMINAL BLOCK FOR PRINTED CIRCUIT BOARDS

[75] Inventors: André Richard, Bron; Daniel Ryckewaert, Villeurbanne, both of France

[73] Assignee: Cgee Slsthom, Levallois-Perret, France

[21] Appl. No.: 394,011

[22] Filed: Jun. 30, 1982

Related U.S. Application Data

[63] Continuation of Ser. No. 239,314, Nov. 19, 1979, abandoned.

[30] Foreign Application Priority Data

Mar. 17, 1978 [FR] France ............ 78 07771

[51] Int. Cl.3 ............ H05K 1/18

[52] U.S. Cl. ............ 361/407; 361/426; 339/17 LM

[58] Field of Search ..... 339/198 G, 198 GA, 17 LM, 339/17 M, 17 C; 361/331, 341, 355, 361, 380–383, 392–396, 399, 420, 426, 427, 400, 404, 406, 407

[56] References Cited

U.S. PATENT DOCUMENTS

| | | | |
|---|---|---|---|
| 2,701,346 | 2/1955 | Powell | 339/17 M |
| 2,832,013 | 4/1958 | Pedersen | 339/17 LM |
| 3,346,777 | 10/1967 | Leonard | 361/355 |
| 3,368,117 | 2/1968 | Pond | 361/415 |
| 3,725,843 | 4/1973 | Johnson | 361/407 |
| 3,777,223 | 12/1973 | Chandler | 361/426 |
| 3,833,839 | 9/1974 | Debaight | 339/198 G |
| 3,891,295 | 6/1975 | Debaight | 339/198 GA |

FOREIGN PATENT DOCUMENTS

| | | |
|---|---|---|
| 699644 | 6/1967 | Belgium . |
| 1933133 | 2/1971 | Fed. Rep. of Germany . |
| 2507904 | 9/1976 | Fed. Rep. of Germany . |
| 2420274 | 10/1980 | France . |

*Primary Examiner*—G. P. Tolin

*Attorney, Agent, or Firm*—Sughrue, Mion, Zinn, Macpeak and Seas

[57] ABSTRACT

The invention relates to a terminal block for printed circuits boards, said terminal block including a base whose sides are intended to be assembled side by side with the sides of the base of an adjacent terminal block to constitute a single assembly therewith, a lower surface intended to be fixed on a common support, a front surface, a back surface and an upper surface which are intended to be connected to electric circuits, the terminal block is characterized in that the upper surface of the base (1) includes insulating supports (34) for a row of electric bus-bars (5) which are disposed parallel to the longitudinal axis of the assembly and are common to the set of blocks thereof, and contact (40) which are disposed facing said electric bars and are parallel thereto, said contact tabs being connected to terminals (4) for exterior connection disposed on the front and rear surfaces of the base, and in that a printed circuit board (7) is disposed transversally on said bars, the lower edge of the board having terminals (9) which are clipped onto the electric bars and the contact pieces. The invention applies to producing control and monitoring installations for electric equipment.

4 Claims, 4 Drawing Figures

TERMINAL BLOCK FOR PRINTED CIRCUIT BOARDS

This is a continuation, of application Ser. No. 239,314, filed Nov. 19, 1979, now abandoned.

The invention relates to a terminal block for printed circuit boards for use in installation where a printed circuit card constitutes a functional logic circuit which converts input data into output data e.g. for monitoring, indicating or controlling applications.

SUMMARY OF THE INVENTION

Such a terminal block therefore normally includes terminals connected to an input circuit, terminals connected to an output circuit and terminals for connection to a printed circuit board. Now, it is advantageous when setting up an installation, to have available standard terminal blocks which allow adaptation or immediate replacement of the logic circuit constituted by a printed circuit board independently from input and output data wires and also independently from the circuitry for the functional polarities inherent to the component circuits of a logic circuit. Further, it is advisable for such adaptation or modification to be made independently within as assembly constituted by disposing terminal blocks side by side, without having to modify the wiring or the circuits of adjacent components.

The invention aims to provide a terminal block which allows such possibilities.

The invention provides a terminal block for printed circuits boards, said terminal block including a base whose sides are intended to be assembled side by side with the sides of the base of an adjacent terminal block to constitute a single assembly therewith, a lower surface intended to be fixed on a common support, a front surface, a back surface and an upper surface which are intended to be connected to electric circuits, said terminal block being characterized in that the upper surface of the base includes insulating supports for a row of electric bus-bars which are disposed parallel to the longitudinal axis of the assembly and are common to the set of blocks thereof and contact tabs which are disposed facing said electric bars and are parallel thereto, said contact tabs being connected to terminals for exterior connection disposed on the front and rear surfaces of the base, and in that a printed circuit board is disposed transversally on said bars, the lower edge of the board having terminals which are clipped onto the electric bars and the contact tabs. The insulating supports of the bars can be constituted by two parallel rows of teeth disposed on the upper surface of the base and forming notches inside which the bars are inserted, said rows delimiting between them an open space which leaves contact surfaces for the bars and for the contact tabs. The terminals of the printed circuit board are connected to said contact surfaces for the bars and for the contact tabs via contact clips which are clipped onto said contact surfaces.

The lower portion of the printed circuit board can be fixed on an insulating frame whose lower end constitutes a comb between whose teeth contact clips are installed. The base and the frame can include resilient means for resiliently fixing the frame on the base.

The printed circuit board can be provided with an insulating hood which includes means for fixing the hood on the frame. The upper portion of the hood can include openings which allow access to monitoring means and control means of the printed circuit board, said means being disposed on its upper edge.

The lower portion of the base can include a stand which includes means for fixing it on the support of the terminal block and the upper portion of the base includes a cover which supports the insulating supports.

The terminals for outside connection are disposed between the stand and the cover as are a connecting strip between said terminals and the contact tabs, said connecting strip passing through the upper surface of the cover.

The lower surfaces of the base can include simultaneously devices for snap-fitting a detachable leg for fixing on a supporting section bar and recesses to accomodate the heads of fixing screws on a support plate.

The characteristics and advantages of the invention will become apparent from the description of an embodiment given by way of example and illustrated in the drawings.

DESCRIPTION OF THE PREFERRED EMBODIMENT

Figure 1:
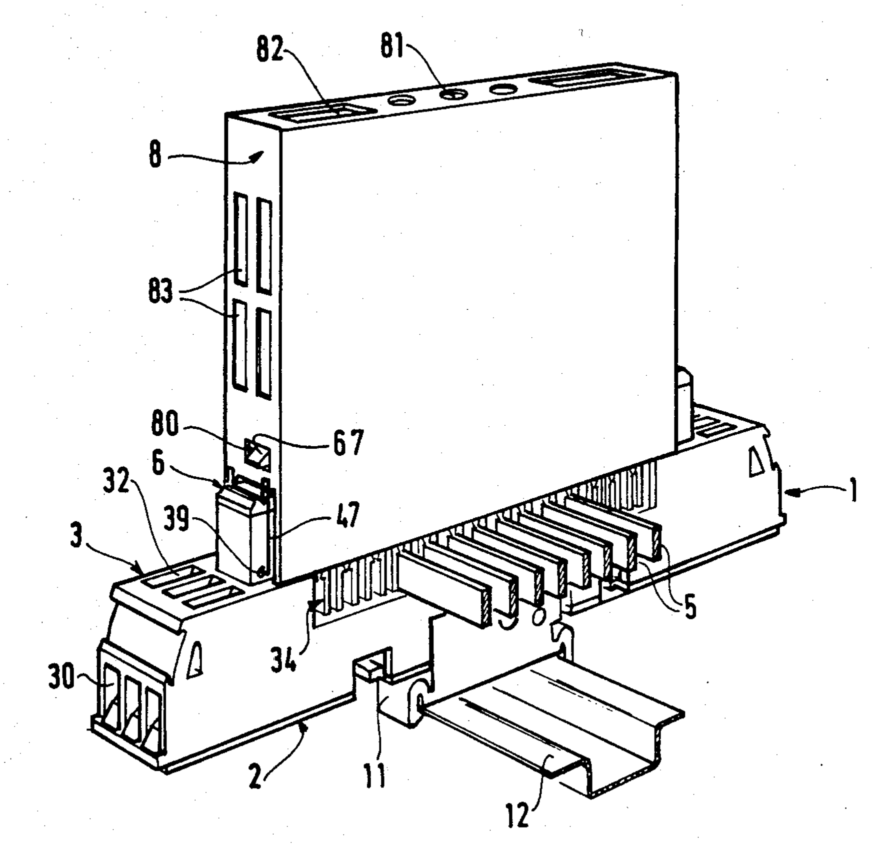
FIG. 1 is a general perspective view of a terminal block embodying the invention.

In the figures, 1 is an assembly formed by the base of a terminal block which includes a stand 2 and a cover 3 made of plastics insulating material.

The base of the stand 2 has a detachable fixing leg 11 installed on a supporting section bar 12. Such a fixing leg is, for example, identical to that described in U.S. Pat. No. 3,891,295. It is therefore possible to mount a set of terminal blocks side by side along the supporting section bar to constitute a strip assembly (not shown in the figures). Another way of fixing terminal blocks is by using fixing screws disposed in recesses 13 on one side of the base and bolted through a support plate, for example, as described in the Applicant's (French) patent application No. 7 807 724.

Figure 2:
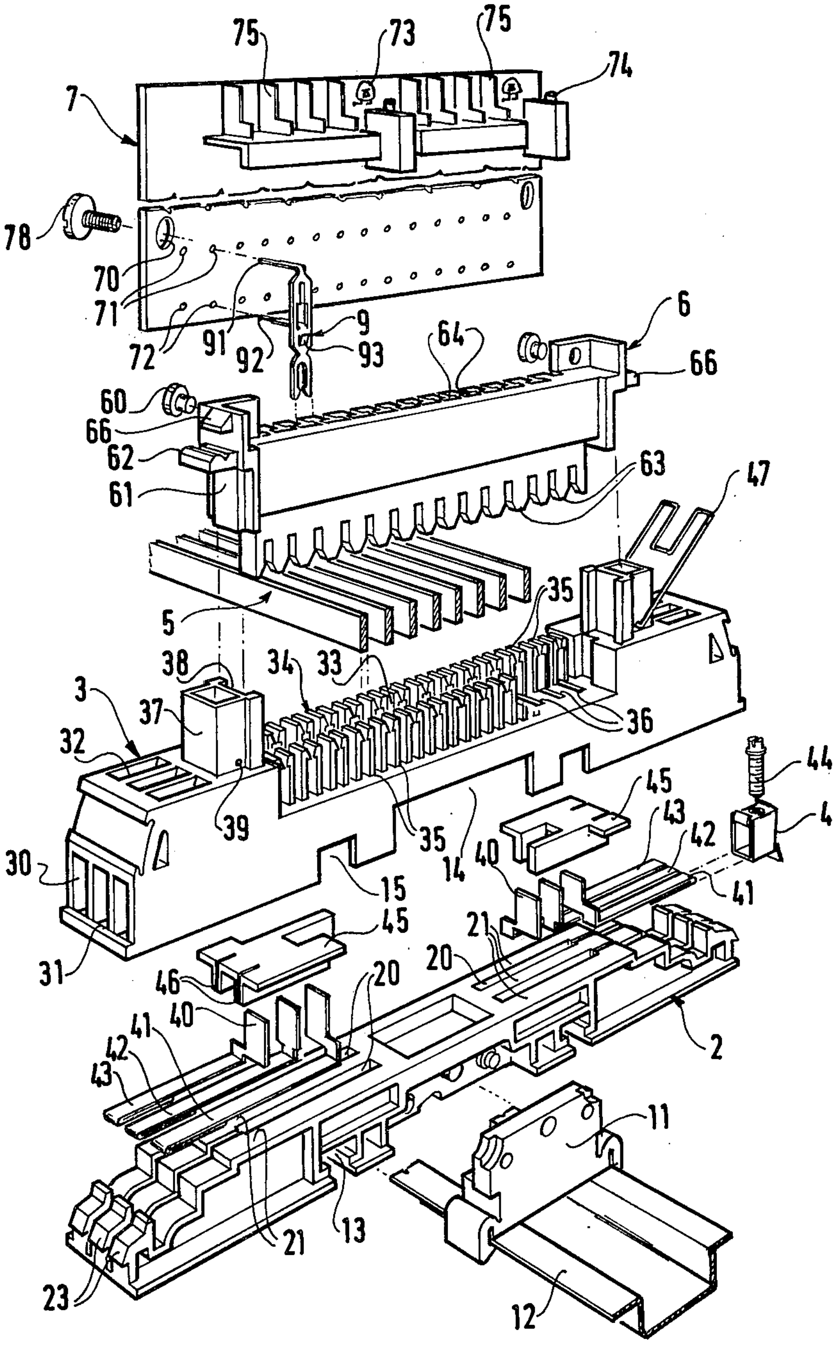
FIG. 2 is an exploded perspective view of the terminal block illustrated in FIG. 1 without its protective hood.
Figure 3:
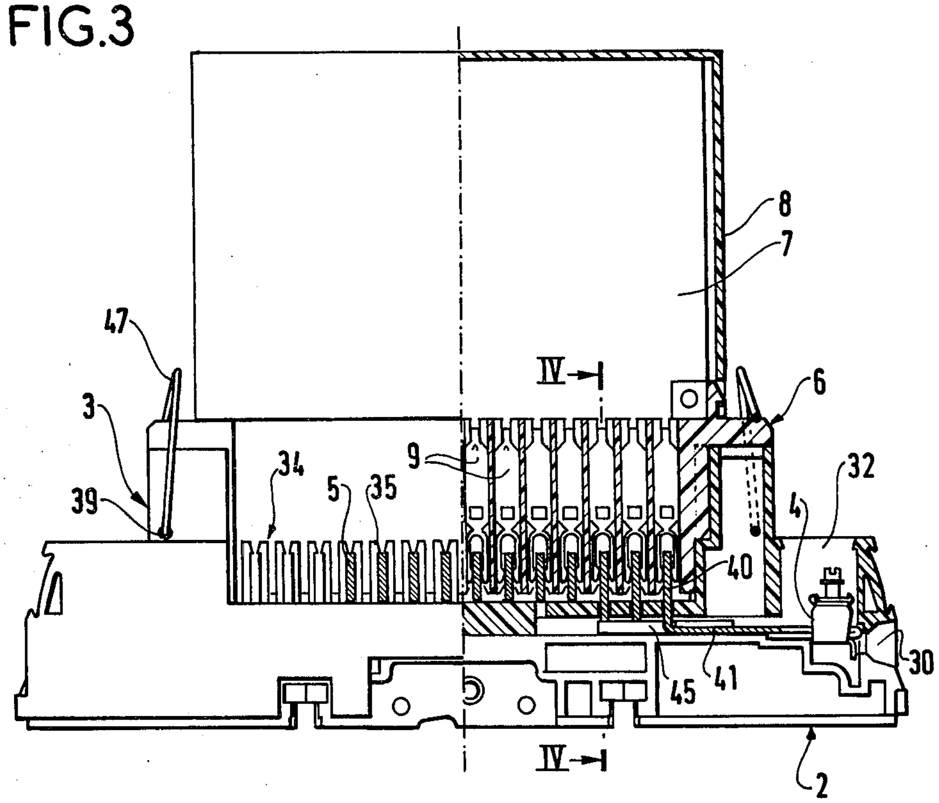
FIG. 3 is a half cutaway view of the transversal surface of the terminal block illustrated in FIG. 1, without its fixing leg or its support stand.

The front and back ends of the upper surface of the stand 2 are each provided with two transversal slots 20 dividing the surface into three ridges 21 each of which has a connecting strip 41, 42 or 43 applied horizontally therealong. Each connecting strip has a terminal 4 for exterior connection to an interior contact tab 40. Each terminal 4, only one of which is illustrated in FIG. 2, is constituted by a clamp with a tightening screw 44. The connecting strips 41, 42 and 43 are bent into a configuration such that the contact tabs are disposed vertically in transversal alignment, and at a given spacing.

Further, the connecting strips are held in place by a plate 45 with rails 46 that engage in the slots 20 to form insulating separators between the connecting strips.

The front and back ends of the stand 2 also have latches 23 to co-operate with a rib 31 disposed at the lower portion of the cover 3 to hook the cover resiliently onto the base.

One side of the cover 3 has cut-outs 14 and 15 to allow the fixing divices of the stand 2 to be positioned on the support.

Figure 4:
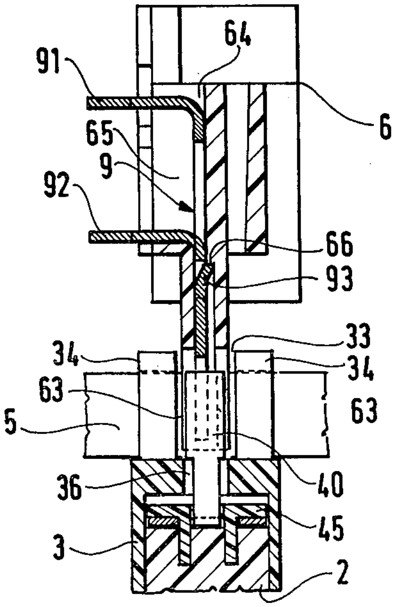
FIG. 4 is an enlarged longitudinal cross-section view along line IV—IV of the terminal block illustrated in FIG. 3.

To provide access to the front and back terminals 4, the front and back surfaces of the cover 3 have openings 30 and its upper surface has openings 32. The central portion of the upper surface of the cover 3 constitutes an insulating support 34 formed by a succession of teeth 35 arranged on either side of an open space 33 illustrated in FIGS. 2 and 4. Bus bars 5 are inserted longitudinally between the teeth. At the ends of the insulating supports 34, the upper surface of the cover 3 is provided with longitudinal slots 36, illustrated in FIG. 2 from which some front teeth 35 have purposely been omitted. These slots are formed in the open space 33 and level with the gaps between pairs of adjacent teeth 35 and allow the contact tabs 40 to pass through, the spacing of the contact tabs corresponding to that of the teeth.

Therefore, between the two rows of teeth of the insulating support 34, the gap leaves flat contact surfaces, firstly on the bars 5 and secondly on the contact tabs 40.

Between the ends of the insulating supports 34 and the openings 32, the upper surface of the cover 3 has two pillars 37 each of which includes a vertical keyway 38 to co-operate with a guide key 61 disposed at the lower portion of an insulating frame 6 whose front and back surfaces have lower catches 62 to lock the frame 6 onto the cover 3 by means of a spring clip 47 whose ends are engaged in holes 39 in the sides of the pillar 37.

The lower portion of the frame 6 has a comb formed by a set of teeth 63 whose spacing corresponds to that of the bars 5 and the contact tabs 40, the teeth being designed to be inserted in these spaces within the open space 33.

One side of the body of the frame 6 includes a set of recesses each formed by lateral slideways 64 which have vertical openings 65 which open out into the gap formed between two successive teeth 63.

Contact clips 9, one of whose surfaces is provided with an upper fixing strut 91 and a lower fixing strut 92 and whose other opposite, surface is provided with a lug 93, are inserted into the slideways 64 through the openings 65, so that the lower fixing struts 92 rest against the lower portions of the slideways 64 and so that the lugs 93 are locked by resilient deformation against shoulders 66 of the slideways 64. When the teeth 63 of the frame 6 are clipped onto the open space 33 in the spaces between the bars 5 and the contact tabs 40, the contact clips 9 grip the apparent contact surfaces of the bars 5 and of the contact tabs 40.

Also, the upper portion of the frame 6 has studs 60 on the same side as the struts 91 and 92. Said studs co-operate with orifices 70 of a printed circuit board 7 to allow the board 7 to be snap-fitted against the frame 6, while the fixing struts 91 and 92 enter holes 71 and 72 for contact with the printed circuit. The fixing of the board 7 on the frame 6 can be completed by screwing screws 78 in tapped holes in the studs 60. Therefore, when the board 7 is fixed on the frame 6 it is possible to connect or disconnect the contact clips 9 which are integral with the lower portions of the board simply by placing the frame on the cover 3 of the stand 2 or by removing it therefrom.

Further, an insulating hood 8 can be fitted on the upper portion of the board 7 and made integral with the frame 6. For this purpose, there are catches 67 on the front and back surfaces of the frame 6 which are able to co-operate with an opening 80 in the front and back surfaces of the hood.

Openings 81 and 82 in the upper surface of the hood allow access to printed circuit monitoring and control means, said circuits being constituted e.g. by light-emitting diodes 73, adjustable resistors 74 and terminals 75 of the printed circuit. Said means are disposed on the upper portion of the board 7. Ventilation holes 83 are also provided on the front and back surfaces of the board 7.

It is obvious that the invention is in no way limited to the embodiment which has just been discribed and illustrated and which has been given by way of example; in particular, without going beyond the scope of the invention, some components can be modified by others which are capable of performing the same technical function or an equivalent technical function.

We claim:

1. A strip assembly comprising, in combination:

a supporting bar, at least one terminal block mounted on said supporting bar and spanning transversely across said supporting bar, said at least one terminal block comprising an insulating support having two, spaced parallel transversely extending rows of teeth on the face opposite said supporting bar forming notches extending parallel to said supporting bar, said rows delimiting an open space therebetween, bus-bars extending parallel to said supporting bar and recieved within given ones of said notches, an insulating frame extending parallel to and above said insulating support, said insulating frame including a set of teeth facing said insulating support, sized to and aligned with said parallel rows of teeth on said insulating support and being positioned within said open space between said rows of teeth of said insulating support, with said bus-bars also interposed between given teeth of said insulating frame, connecting strips borne by said insulating support and including contact tabs projecting upwardly therefrom within other given ones of said notches between said two parallel rows of teeth at locations other than the notches receiving said bus-bars and within said open space, said contact tabs extending parallel to said bus-bars and being connected to terminals at opposite ends of said at least one terminal block for permitting exterior connection;

a printed circuit board having protruding contact clips located on a lower edge of said circuit board including portions projecting below said lower edge, said printed circuit board being detachably mounted to said insulating frame such that the protruding portions of said contact clips project into said open space with given ones of said contact clips engaging said bus-bars and others of said contact clips engaging said contact tabs to effect electrical connection between said printed circuit board, said bus-bars and said contact tabs.

2. The assembly as claimed in claim 1, wherein said insulating frame comprises slideways slidably receiving the contact clips of said circuit board, each slideway opening into the gap between two teeth of each set of teeth to facilitate engagement between given clips of said circuit board and said contact tabs and between given clips and said bus-bars.

3. The assembly as claimed in claim 2, further comprising an insulating hood sized to said circuit board and being detachably coupled to said insulating frame by resilient means.

4. The assembly as claimed in claim 1, wherein said block comprises a stand mounted to said supporting bar, a cover overlying said stand, means for resiliently fixing said stand and said cover together, and wherein said connecting strips extend along the upper surface of said stand and are interposed between said stand and said cover and terminate at their ends remote from said contact tabs in terminals projecting beyond the ends of said stand for exterior connections, and wherein said cover bears slots and said contact tabs pass through said cover via said slots.

* * * * *